(12) United States Patent
Yang et al.

(10) Patent No.: US 7,989,804 B2
(45) Date of Patent: Aug. 2, 2011

(54) TEST PATTERN STRUCTURE

(75) Inventors: Da-Jiang Yang, Singapore (SG);
Chih-Ping Lee, Singapore (SG);
Rui-Huang Cheng, Singapore (SG);
Xing-Hua Zhang, Singapore (SG); Xu Ma, Singapore (SG); Xiao-Fei Han, Singapore (SG); Hong Ma, Singapore (SG); Hong Liao, Singapore (SG);
Yuan-Li Ding, Singapore (SG)

(73) Assignee: United Microelectronics Corp., Hsinchu (TW)

(*) Notice: Subject to any disclaimer, the term of this patent is extended or adjusted under 35 U.S.C. 154(b) by 92 days.

(21) Appl. No.: 12/397,662

(22) Filed: Mar. 4, 2009

(65) Prior Publication Data

US 2010/0227131 A1 Sep. 9, 2010

(51) Int. Cl.
*H01L 23/58* (2006.01)

(52) U.S. Cl. .................................. 257/48; 257/E23.179
(58) Field of Classification Search .................... 257/48, 257/E23.179
See application file for complete search history.

(56) References Cited

U.S. PATENT DOCUMENTS

| 5,262,719 A | 11/1993 | Magdo | |
|---|---|---|---|
| 2009/0159883 A1* | 6/2009 | Lee | 257/48 |

* cited by examiner

*Primary Examiner* — Trung Dang
(74) *Attorney, Agent, or Firm* — J.C. Patents

(57) ABSTRACT

A test pattern structure including a first conductive layer and a second conductive layer is provided. The second conductive layer is directly disposed on the first conductive layer and connected to the first conductive layer through a plurality of connection interfaces. The test pattern structure of the present invention can detect the interconnection failure quickly and correctly without SEM identification.

17 Claims, 3 Drawing Sheets

TEST PATTERN STRUCTURE

BACKGROUND OF THE INVENTION

1. Field of Invention

The present invention relates to a semiconductor structure, and more generally to a test pattern structure.

2. Description of Related Art

Generally, a semiconductor device is fabricated by performing a series of processes including deposition processes, photolithography processes, etching processes, and ion implantation processes. Upon completion of one or more of the above-mentioned processes, defects such as particles, misalignments, over-etching or under-etching may be generated in the semiconductor device. Therefore, various test pattern structures are designed in the scribe line region for testing the performance of the semiconductor devices in the chip or monitoring defect existence and distribution within the wafer.

Rc (contact resistance) of a contact or via is an index for the interconnection performance. FIG. 1 schematically illustrates a conventional test pattern structure in a cross-sectional view. Referring to FIG. 1, a metal line 12, via plugs 14 and another metal line 16 are sequentially disposed on a substrate 10. The metal line 12, the via plugs 14 and the metal line 16 are connected to form a serpentine structure. Either discontinuity within the serpentine structure or poor interface between the metal line and the via plug would render the measured resistance high. However, when high Rc of via occurs, it is difficult to identify that the failure interface is between the metal line 12 and the via plugs 14 (connection interface A) or between the via plugs 14 and the metal line 16 (connection interface B), unless a time-consuming cross-section SEM is implemented. Moreover, since the cross-section SEM is usually conducted at a single point, the mapping of failure interfaces through the wafer is unlikely to be obtained.

Accordingly, a test pattern structure which can identify the failure interface in the interconnection structure quickly and correctly without performing a cross-section SEM is deeply desired in the industry.

SUMMARY OF THE INVENTION

The present invention provides a test pattern structure, by which the correct failure interface in the interconnection structure is simply identified and the wafer mapping of failure interfaces is easily obtained without performing a cross-section SEM.

The present invention provides a test pattern structure including a first conductive layer and a second conductive layer. The second conductive layer is disposed directly on the first conductive layer and connected to the first conductive layer through a plurality of connection interfaces.

According to an embodiment of the present invention, the test pattern structure further includes two terminals connected to the first conductive layer or the second conductive layer, so as to measure the resistance between the two terminals.

According to an embodiment of the present invention, the first conductive layer includes a plurality of conductive plugs and the second conductive layer includes a plurality of conductive lines.

According to an embodiment of the present invention, each conductive plug is a contact plug and each conductive line is a polysilicon line.

According to an embodiment of the present invention, each conductive plug is a contact plug and each conductive line is a metal line.

According to an embodiment of the present invention, each conductive plug is a via plug and each conductive line is a metal line.

According to an embodiment of the present invention, the conductive plugs include metal, metal nitride or combinations thereof, and the conductive lines include polysilicon, polycide, metal, metal nitride or combinations thereof, for example.

According to an embodiment of the present invention, the first conductive layer includes a plurality of conductive lines and the second conductive layer includes a plurality of conductive plugs.

According to an embodiment of the present invention, each conductive line is a polysilicon line and each conductive plug is a contact plug.

According to an embodiment of the present invention, each conductive line is a metal line and each conductive plug is a via plug.

According to an embodiment of the present invention, the conductive lines include polysilicon, polycide, metal, metal nitride or combinations thereof, and the conductive plugs include metal, metal nitride or combinations thereof, for example.

According to an embodiment of the present invention, the first conductive layer includes a plurality of doped regions and the second conductive layer includes a plurality of contact plugs.

According to an embodiment of the present invention, the contact plugs include metal, metal nitride or combinations thereof, for example.

According to an embodiment of the present invention, the first conductive line includes a plurality of first metal lines and the second conductive layer includes a plurality of second metal lines.

According to an embodiment of the present invention, the first metal lines include metal, metal nitride or combinations thereof, and the second metal lines include metal, metal nitride or combinations thereof, for example.

According to an embodiment of the present invention, the test pattern structure further includes at least one dielectric layer or at least one underlying conductive layer disposed below the first conductive layer.

According to an embodiment of the present invention, the dielectric layer includes a low-k dielectric material, oxide, silicon carbide, silicon nitride, silicon oxynitride or combinations thereof, for example.

According to an embodiment of the present invention, the underlying conductive layer includes polysilicon, polycide, metal, metal nitride or combinations thereof, for example.

In summary, the test pattern structures of the present invention can be applied to detect the interconnection failure quickly and correctly without SEM identification. Further, the wafer mapping of failure interfaces can be easily obtained. Therefore, the cost is saved, the efficiency is enhanced and the competitiveness is improved.

In order to make the aforementioned and other objects, features and advantages of the present invention comprehensible, a preferred embodiment accompanied with figures is described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

First Embodiment

Figure 1:
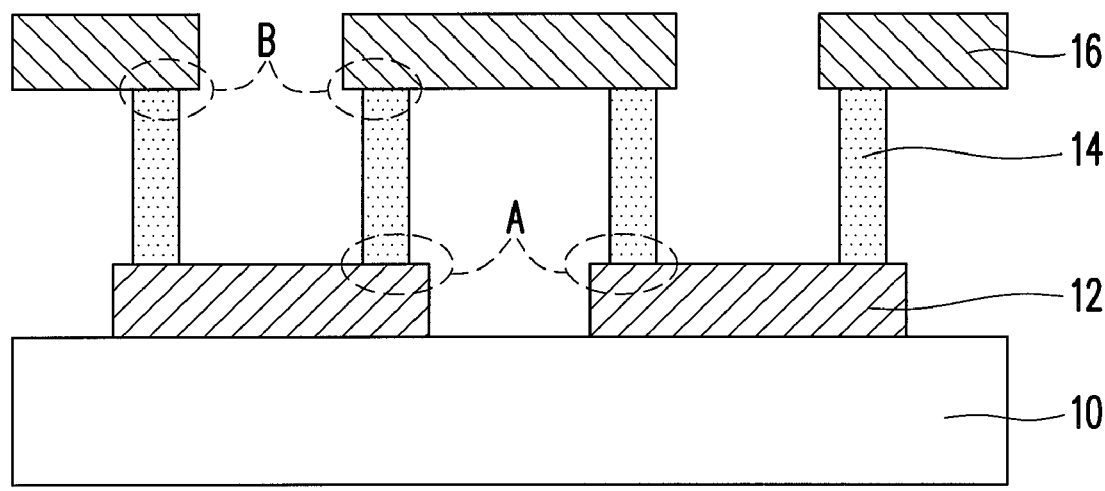
FIG. 1 schematically illustrates a conventional test pattern structure in a cross-sectional view.
Figure 2:
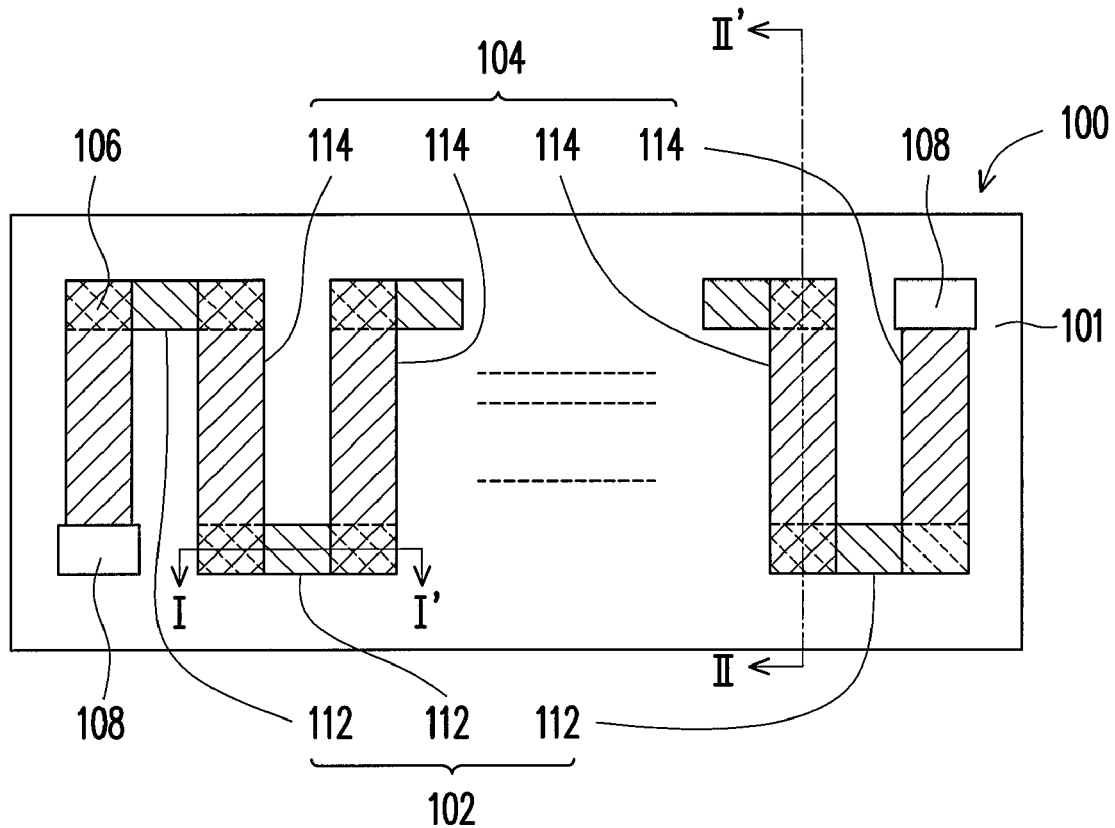
FIG. 2 schematically illustrates, in a top view, a test pattern structure according to a first embodiment of the present invention.
Figure 3:
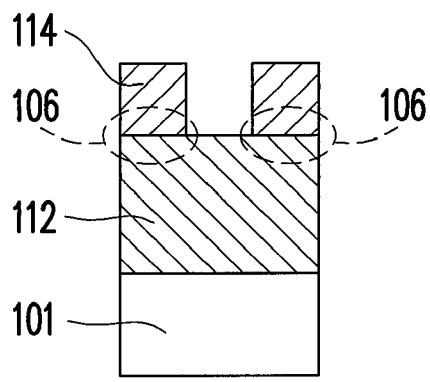
FIG. 3 schematically illustrates a cross-sectional view taken along the line I-I' in FIG. 2.
Figure 4:
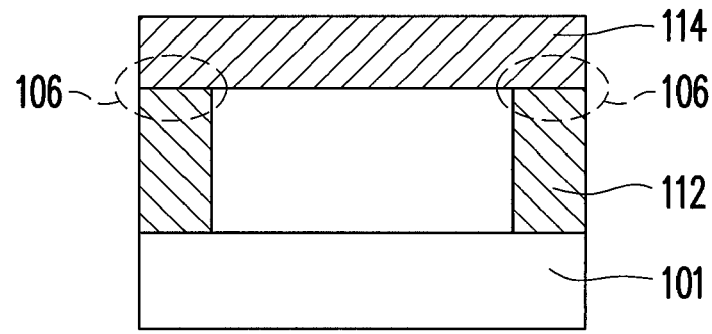
FIG. 4 schematically illustrates a cross-sectional view taken along the line II-II' in FIG. 2.

FIG. 2 schematically illustrates, in a top view, a test pattern structure according to a first embodiment of the present invention. FIG. 3 schematically illustrates a cross-sectional view taken along the line I-I' in FIG. 2. FIG. 4 schematically illustrates a cross-sectional view taken along the line II-II' in FIG. 2.

Referring to FIGS. 2, 3 and 4, a test pattern structure 100 includes a first conductive layer 102 and a second conductive layer 104. The second conductive layer 104 is disposed on the first conductive layer 102 and directly connected to the first conductive layer 102 through a plurality of connection interfaces 106. In this embodiment, the first conductive layer 102 includes a plurality of conductive plugs 112 and the second conductive layer 104 includes a plurality of conductive lines 114. For example, each conductive plug 112 is a contact plug and each conductive line 114 is a polysilicon line, each conductive plug 112 is a contact plug and each conductive line 114 is a metal line, or each conductive plug 112 is a via plug and each conductive line 114 is a metal line. The conductive plugs 112 include metal, metal nitride or combinations thereof, and the conductive lines 114 include polysilicon, polycide, metal, metal nitride or combinations thereof, for example. In details, the material of the conductive plugs 112 is selected from the group consisting W, Cu, Al, Ti, TiN, Ta, TaN and combinations thereof, and the material of the conductive lines 114 is selected from the group consisting of silicon, doped-silicon, silicide, polysilicon, polycide, Al, Cu, Ta, TaN, Ti, TiN and combinations thereof. Moreover, the test structure 100 can optionally include at least one dielectric layer 101 or at least one underlying conductive layer (not shown) disposed below the first conductive layer 102. The dielectric layer 101 includes a low-k dielectric material, oxide, silicon nitride, silicon oxynitride, silicon carbide or combinations thereof, for example. The underlying conductive layer includes polysilicon, polycide, metal, metal nitride or combinations thereof, for example. In details, the material of the underlying conductive layer is selected from the group consisting of silicon, doped-silicon, silicide, polysilicon, polycide, Al, Cu, Ta, TaN, Ti, TiN and combinations thereof. It is noted that the figures are only for explanation and illustration and elements shown in the figures are not necessarily in proportional scale. For example, even though in the figure conductive plugs 112 are thicker than conductive lines 114, in the reality it can be the other way around. In another example, in the figure the length of conductive lines 114 is compatible with the length of conductive plugs 112; however in the reality the former one can be much longer than the later one.

In addition, the test pattern structure 100 further includes two terminals 108 electrically coupled to the second conductive layer 104, so as to measure the resistance between the two terminals 108. The terminals 108 include upper interconnection layers connected to probe pads and probe pads, for example. In the test pattern structure 100, the measured resistance mainly includes the resistance of the first conductive layer 102, the resistance of the second conductive layer 104 and the resistance of the connection interfaces 106. Since the first conductive layer 102 and the second conductive layer 104 are commonly more robust than the connection interfaces 106 and have fairly low resistance, high measured resistance usually means the failure on the connection interfaces 106.

Second Embodiment

Figure 5:
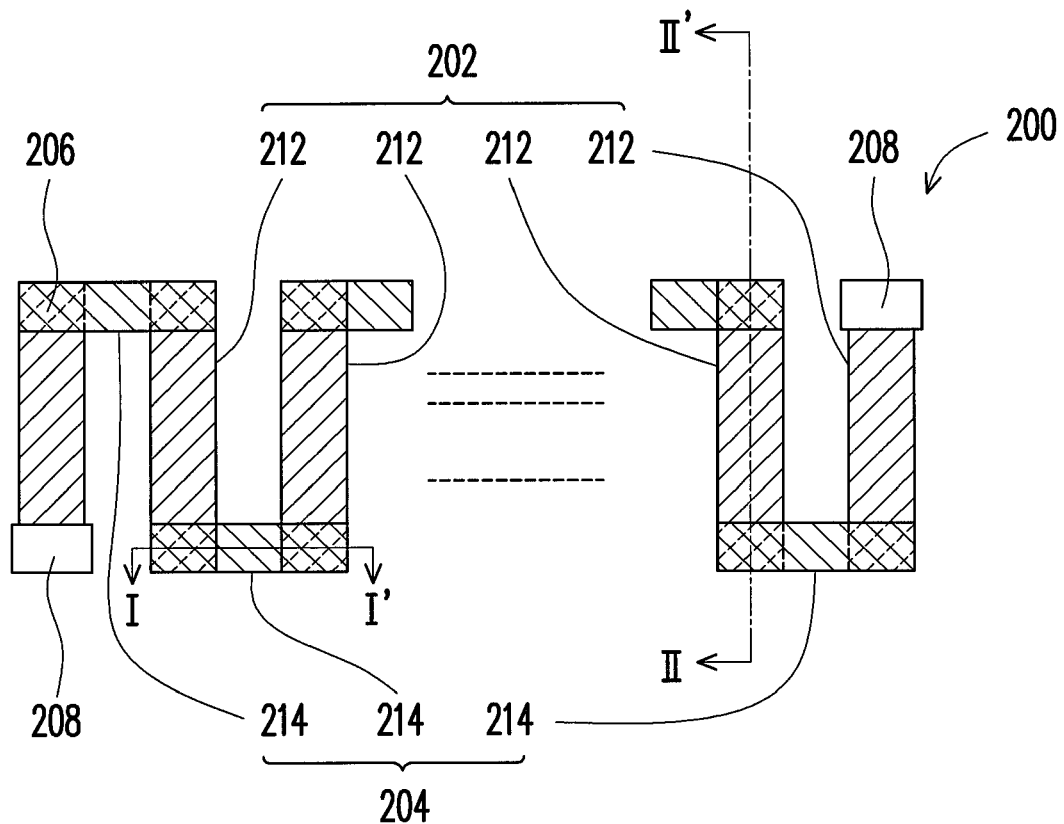
FIG. 5 schematically illustrates, in a top view, a test pattern structure according to a second embodiment of the present invention.
Figure 6:
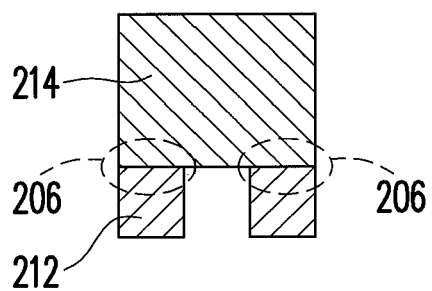
FIG. 6 schematically illustrates a cross-sectional view taken along the line I-I' in FIG. 5.
Figure 7:
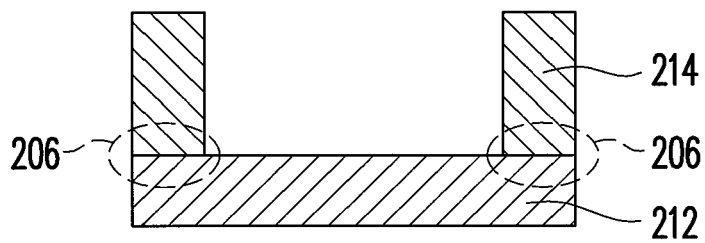
FIG. 7 schematically illustrates a cross-sectional view taken along the line II-II' in FIG. 5.

FIG. 5 schematically illustrates, in a top view, a test pattern structure according to a second embodiment of the present invention. FIG. 6 schematically illustrates a cross-sectional view taken along the line I-I' in FIG. 5. FIG. 7 schematically illustrates a cross-sectional view taken along the line II-II' in FIG. 5.

Referring to FIGS. 5, 6 and 7, a test pattern structure 200 includes a first conductive layer 202 and a second conductive layer 204. The second conductive layer 204 is disposed directly on the first conductive layer 202 and connected to the first conductive layer 202 through a plurality of connection interfaces 206. In this embodiment, the first conductive layer 202 includes a plurality of conductive lines 212 and the second conductive layer 204 includes a plurality of conductive plugs 214. For example, each conductive line 212 is a polysilicon line and each conductive plug 214 is a contact plug, or each conductive line 212 is a metal line and each conductive plug 214 is a via plug. The conductive lines 212 include polysilicon, polycide, metal, metal nitride or combinations thereof, and the conductive plugs 214 include metal, metal nitride or combinations thereof, for example. In details, the material of the conductive lines 212 is selected from the group consisting of silicon, doped-silicon, silicide, polysilicon, polycide, Al, Cu, Ta, TaN, Ti, TiN and combinations thereof, and the material of the conductive plugs 214 is selected from the group consisting of W, Cu, Al, Ti, TiN, Ta, TaN and combinations thereof.

In addition, the test pattern structure 200 further includes two terminals 208 electrically coupled to the first conductive layer 202, so as to measure the resistance between the two terminals 208. The terminals 208 include upper interconnection layers connected to probe pads and probe pads, for example. In the test pattern structure 200, the measured resistance mainly includes the resistance of the first conductive layer 202, the resistance of the second conductive layer 204 and the resistance of the connection interfaces 206. Since the first conductive layer 202 and the second conductive layer 204 are commonly more robust than the connection interfaces 206 and have fairly low resistance, high measured resistance usually means the failure on the connection interfaces 206.

In the present invention, the test pattern structures 100 and 200 can detect the failure interface in the interconnection structure independently without SEM identification, so that the cost is saved, the efficiency is enhanced and the competitiveness is improved.

The present invention is illustrated with the first and second embodiments but is not limited thereto. In an embodiment, the first conductive layer can include a plurality of doped regions and the second conductive layer can include a plurality of contact plugs. The doped regions include source and drain regions and the contact plugs include metal, metal nitride or combinations thereof, for example. In details, the material of the contact plugs is selected from the group consisting of W, Cu, Al, Ti, TiN, Ta, TaN and combinations thereof. In another embodiment, the first conductive layer can include a plurality of first metal lines and the second conductive layer can include a plurality of second metal lines. The first metal lines include metal, metal nitride or combinations thereof, and the second metal lines include metal, metal nitride or combinations thereof, for example. In details, the material of the first metal lines is selected from the group consisting of Al, Cu, Ta, TaN, Ti, TiN and combinations thereof, and the material of the second metal lines is selected from the group consisting of Al, Cu, Ta, TaN, Ti, TiN and combinations thereof. According to the above-mentioned embodiments, it is appreciated by persons skilled in the art that the test pattern structures of the present invention can be applied to a process flow including a single-poly process, a double-poly process, a single-metal process, a double-metal process, a multi-metal process, a single damascene process or combinations thereof.

In summary, the difficulty in identifying the failure interface in the conventional test pattern structure can be easily resolved with the test pattern structures of the present invention. In other word, when high Rc of contact or via occurs, the failure interface in the interconnection structure can be identified independently without performing a time-consuming cross-section SEM. The test pattern structures of the present invention can be applied to the inline process to detect the interconnection failure quickly and correctly. Further, the mapping of failure interfaces through the wafer can be easily obtained.

This invention has been disclosed above in the preferred embodiments, but is not limited to those. It is known to persons skilled in the art that some modifications and innovations may be made without departing from the spirit and scope of this invention. Hence, the scope of this invention should be defined by the following claims.

What is claimed is:

1. A test pattern structure, consisting of:
   a first conductive layer; and
   a second conductive layer, directly disposed on the first conductive layer and connected to the first conductive layer through a plurality of connection interfaces, wherein the first conductive layer comprises a plurality of first conductive patterns, the second conductive layer comprises a plurality of second conductive patterns, and the first conductive patterns and the second conductive patterns form a contiguous structure.

2. The structure of claim 1, wherein the first conductive patterns comprise a plurality of conductive plugs and the second conductive patterns-comprise a plurality of conductive lines.

3. The structure of claim 2, wherein each conductive plug is a contact plug and each conductive line is a polysilicon line.

4. The structure of claim 2, wherein each conductive plug is a contact plug and each conductive line is a metal line.

5. The structure of claim 2, wherein each conductive plug is a via plug and each conductive line is a metal line.

6. The structure of claim 2, wherein the conductive plugs comprise metal, metal nitride or combinations thereof, and the conductive lines comprise polysilicon, polycide, metal, metal nitride or combinations thereof.

7. The structure of claim 1, wherein the first conductive patterns comprise a plurality of conductive lines and the second conductive patterns-comprise a plurality of conductive plugs.

8. The structure of claim 7, wherein each conductive line is a polysilicon line and each conductive plug is a contact plug.

9. The structure of claim 7, wherein each conductive line is a metal line and each conductive plug is a via plug.

10. The structure of claim 7, wherein the conductive lines comprise polysilicon, polycide, metal, metal nitride or combinations thereof, and the conductive plugs comprise metal, metal nitride or combinations thereof.

11. The structure of claim 1, wherein the first conductive patterns comprise a plurality of doped regions and the second conductive patterns-comprise a plurality of contact plugs.

12. The structure of claim 11, wherein the contact plugs comprise metal, metal nitride or combinations thereof.

13. The structure of claim 1, wherein the first conductive patterns comprise a plurality of first metal lines and the second conductive patterns-comprise a plurality of second metal lines.

14. The structure of claim 13, wherein the first metal lines comprise metal, metal nitride or combinations thereof, and the second metal lines comprise metal, metal nitride or combinations thereof.

15. The structure of claim 1, further comprising at least one dielectric layer or at least one underlying conductive layer disposed below the first conductive layer.

16. The structure of claim 15, wherein the dielectric layer comprises a low-k dielectric material, oxide, silicon carbide, silicon nitride, silicon oxynitride or combinations thereof.

17. The structure of claim 15, wherein the underlying conductive layer comprises polysilicon, polycide, metal, metal nitride or combinations thereof.

* * * * *